(12) United States Patent
Hunter et al.

(10) Patent No.: US 7,564,307 B2
(45) Date of Patent: Jul. 21, 2009

(54) COMMON MODE FEEDBACK AMPLIFIER WITH SWITCHED DIFFERENTIAL CAPACITOR

(75) Inventors: Bradford L. Hunter, South Burlington, VT (US); Gregory J. Schroer, Honeoye Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 41 days.

(21) Appl. No.: 11/849,625

(22) Filed: Sep. 4, 2007

(65) Prior Publication Data

US 2009/0058526 A1 Mar. 5, 2009

(51) Int. Cl.
*H03F 3/45* (2006.01)
(52) U.S. Cl. .......................... 330/258; 330/69
(58) Field of Classification Search .................. None
See application file for complete search history.

(56) References Cited

U.S. PATENT DOCUMENTS

| | | | | |
|---|---|---|---|---|
| 4,697,152 A | * | 9/1987 | Westwick | 330/9 |
| 4,720,686 A | | 1/1988 | Westwick | |
| 4,780,630 A | * | 10/1988 | Corpechot et al. | 327/361 |
| 4,794,349 A | * | 12/1988 | Senderowicz et al. | 330/253 |
| 4,820,998 A | * | 4/1989 | Roessler et al. | 330/258 |
| 5,008,632 A | * | 4/1991 | Sutterlin | 330/256 |
| 5,838,199 A | * | 11/1998 | Nakamura | 330/258 |
| 5,838,200 A | * | 11/1998 | Opris | 330/258 |
| 5,847,601 A | * | 12/1998 | Wang | 330/9 |
| 5,880,634 A | * | 3/1999 | Babanezhad | 330/126 |
| 5,914,638 A | | 6/1999 | He | |
| 5,933,056 A | * | 8/1999 | Rothenberg | 330/258 |
| 5,942,942 A | * | 8/1999 | Wang | 330/258 |
| 5,955,922 A | * | 9/1999 | Nicollini et al. | 330/258 |
| 5,973,537 A | * | 10/1999 | Baschirotto et al. | 327/337 |
| 6,031,480 A | * | 2/2000 | Soenen et al. | 341/161 |
| 6,573,785 B1 | * | 6/2003 | Callicotte et al. | 330/9 |
| 6,577,184 B2 | * | 6/2003 | Kwan et al. | 330/9 |
| 6,577,185 B1 | * | 6/2003 | Chandler et al. | 330/9 |
| 6,696,890 B2 | * | 2/2004 | Hedberg et al. | 330/9 |
| 6,697,001 B1 | | 2/2004 | Oliaei et al. | |
| 6,750,704 B1 | * | 6/2004 | Connell et al. | 330/9 |
| 6,768,374 B1 | * | 7/2004 | Lee | 330/51 |
| 6,778,009 B1 | * | 8/2004 | Lee | 330/69 |
| 6,781,451 B2 | * | 8/2004 | Kwan et al. | 330/9 |
| 6,812,784 B2 | * | 11/2004 | Michalski | 330/9 |

(Continued)

OTHER PUBLICATIONS

Hernandez-Garduno et al., "Continuous-Time Common-Mode Feedback for High-Speed Switched-Capacitor Networks," IEEE Journal of Solid-State Circuits, vol. 40, No. 8, Aug. 2005, pp. 1610-1617.

(Continued)

*Primary Examiner*—Robert Pascal
*Assistant Examiner*—Krista M Flanagan
(74) *Attorney, Agent, or Firm*—W. Riyon Harding; Hoffman Warnick LLC

(57) ABSTRACT

A structure and related design structure for providing a common mode feedback to a differential amplifier are disclosed. A common mode feedback amplifier is connected to a differential amplifier to provide common mode feedback voltage thereto. An input of the common mode feedback amplifier is shorted to an output terminal of the differential amplifier during a sampling phase, and is coupled to the differential output voltage through two matched capacitors during a holding phase.

6 Claims, 5 Drawing Sheets

U.S. PATENT DOCUMENTS

| | | | | |
|---|---|---|---|---|
| 6,888,407 | B2* | 5/2005 | Ramazan et al. | 330/258 |
| 6,930,545 | B2* | 8/2005 | Kwan et al. | 330/9 |
| 6,940,348 | B2* | 9/2005 | Confalonieri et al. | 330/69 |
| 6,965,268 | B2* | 11/2005 | Dyer et al. | 330/258 |
| 7,012,463 | B2* | 3/2006 | Nairn | 330/9 |
| 7,042,384 | B2* | 5/2006 | Shimizu et al. | 341/156 |
| 7,053,711 | B2* | 5/2006 | Bogner | 330/253 |
| 7,088,149 | B2* | 8/2006 | Udupa et al. | 327/563 |
| 7,154,334 | B2* | 12/2006 | Dyer et al. | 330/258 |
| 7,230,482 | B2* | 6/2007 | Chelli et al. | 330/69 |
| 7,253,686 | B2* | 8/2007 | Ali | 330/259 |
| 7,295,070 | B2* | 11/2007 | Dillon | 330/258 |
| 7,365,597 | B2* | 4/2008 | Forbes | 330/9 |

OTHER PUBLICATIONS

Sin et al., "a Novel Very Low-Voltage SC-CMFB Technique for Fully-Differential Reset-Opamp Circuits," IEEE, 2005, pp. 1581-1584.

Arias et al., "Design of a CMOS Fully Differential Switched-Opamp for SC Circuits at Very Low Power Supply Voltages," IEEE, 2001, pp. 1545-1548.

* cited by examiner

COMMON MODE FEEDBACK AMPLIFIER WITH SWITCHED DIFFERENTIAL CAPACITOR

BACKGROUND

1. Technical Field

The disclosure relates generally to electrical circuits and designs, and more particularly, to structures for providing common mode feedback to a differential amplifier and related design structures.

2. Background Art

Common mode feedback of a fully differential amplifier is typically provided by a secondary amplifier (referred to as a "common mode feedback amplifier") that compares the differential output voltages to a common mode reference voltage and feedbacks the difference (from the comparison) to the fully differential amplifier to cancel out common mode offsets. In a closed loop configuration, the input voltages to the fully differential amplifier have a restricted swing of less than plus or minus 10 mV. The pair of differential inputs can operate successfully with small differential separation of the input voltages and remain in a normal operation state. The input voltages to the common mode feedback amplifier, on the other hand, are exposed to the full differential swing of the differential output voltages of the fully differential amplifier. The swing of the differential output voltages could be plus or minus 500 mV or more. Such large swings may cause the common mode feedback amplifier to enter a non-linear operation state with a common mode gain of 0 decibel (dB). In fact, a common mode gain can be 0 dB with a differential swing of as little as approximately 100 mV.

To combat this problem, switched capacitor common mode feedback is often employed. For example, U.S. Pat. No. 5,838,200 to Opris discloses a circuit structure as shown in FIG. 1. In FIG. 1, differential amplifier 200 output voltages are shorted together during sampling phase through switches 202 and 204. During the holding phase, common mode feedback amplifier 206 is disconnected at the output thereof through switch 208. CMFB amplifier 206 output bias voltage 214 is thus commonly modulated by two differential capacitors 210, 212 connected to differential amplifier 200 output voltages.

SUMMARY

A structure and related design structure for providing a common mode feedback to a differential amplifier are disclosed. A common mode feedback amplifier is connected to a differential amplifier to provide common mode feedback voltage thereto. An input of the common mode feedback amplifier is shorted to an output terminal of the differential amplifier during a sampling phase, and is coupled to the differential output voltage through two matched capacitors during a holding phase.

A first aspect is directed to a structure, comprising: a differential amplifier including a first output terminal, a second output terminal and a common mode feedback input terminal; a common mode feedback amplifier including a first input terminal configured to receive a common mode reference voltage, a second input terminal, and a feedback output terminal electrically connected to the common mode feedback input terminal and configured to provide a feedback voltage in accordance with a difference between the common mode reference voltage and a voltage at the second input terminal; a first switch coupled between the second input terminal and at least one of the first output terminal and the second output terminal, the first switch having an on state during a first time period and an off state during a second time period; and a first pair of substantially matched capacitors, one of the first capacitor pair coupled between the second input terminal and the first output terminal, the other of the first capacitor pair coupled between the second input terminal and the second output terminal.

A second aspect is directed to a design structure embodied in a machine readable medium used in a design flow process, the design structure comprising a circuit, the circuit comprising: a differential amplifier including a first output terminal, a second output terminal and a common mode feedback input terminal; a common mode feedback amplifier including a first input terminal configured to receive a common mode reference voltage, a second input terminal, and a feedback output terminal electrically connected to the common mode feedback input terminal and configured to provide a feedback voltage in accordance with a difference between the common mode reference voltage and a voltage at the second input terminal; a first switch coupled between the second input terminal and at least one of the first output terminal and the second output terminal, the first switch having an on state during a first time period and an off state during a second time period; and a first pair of substantially matched capacitors, one of the first capacitor pair coupled between the second input terminal and the first output terminal, the other of the first capacitor pair coupled between the second input terminal and the second output terminal.

The illustrative aspects of the present disclosure are designed to solve the problems herein described and other problems not discussed.

BRIEF DESCRIPTION OF THE DRAWINGS

These and other features will be more readily understood from the following detailed description taken in conjunction with the accompanying drawings.

Figure 1:
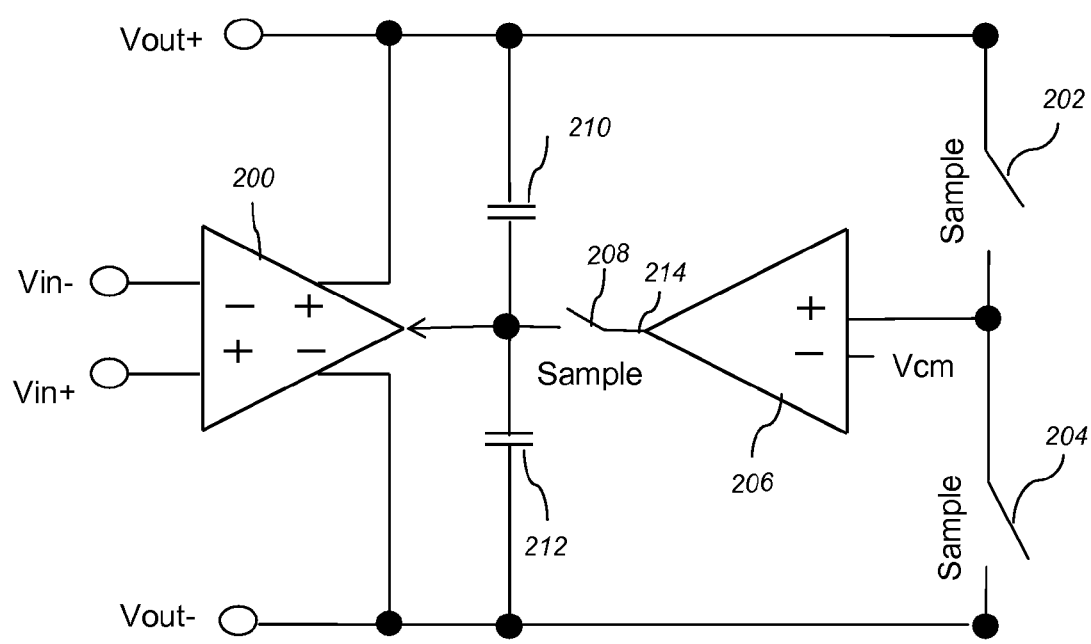
FIG. 1 depicts a conventional differential amplifier with a switched capacitor common mode feedback.

The drawings are merely schematic representations, not intended to portray specific parameters of the present disclosure. The drawings are intended to depict only typical embodiments of the disclosure, and therefore should not be considered as limiting the scope of the disclosure. In the drawings, like numbering represents like elements.

DETAILED DESCRIPTION

Figure 2:
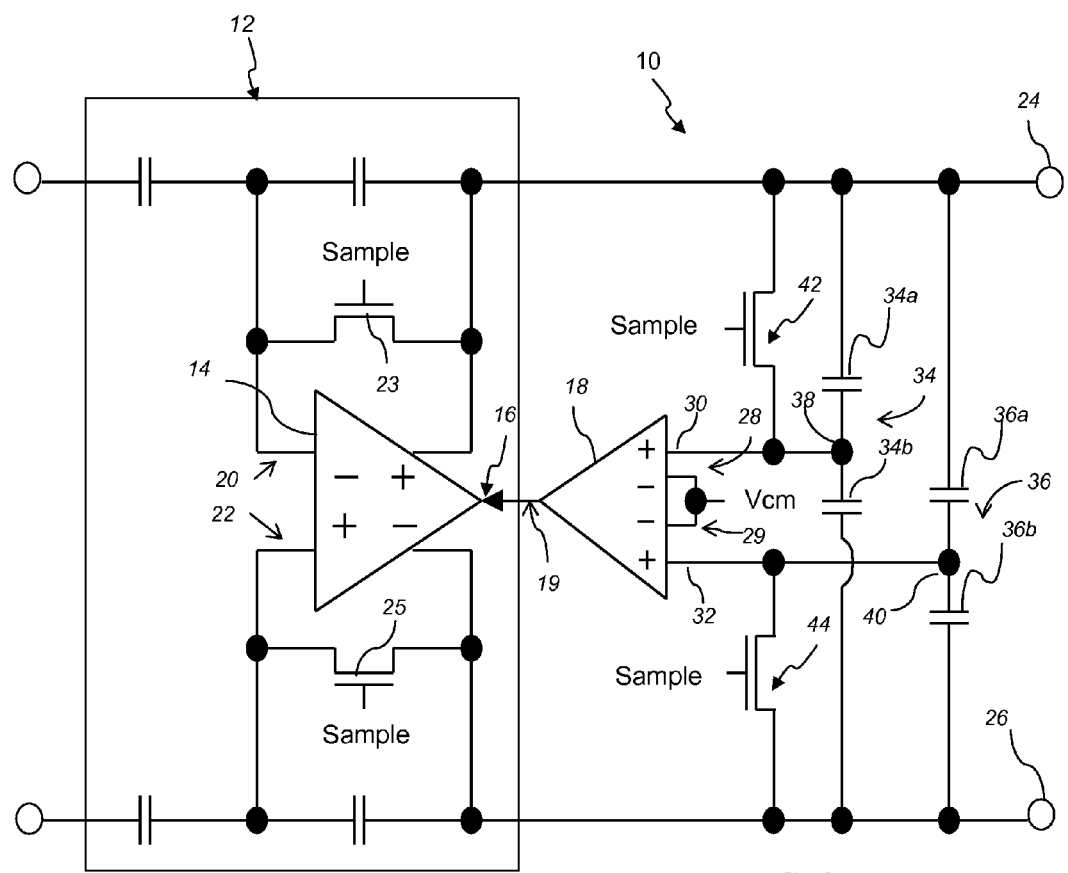
FIG. 2 depicts a structure according to an embodiment.

An illustrative circuit 10, e.g., an integrated circuit, in accordance with an embodiment of the disclosure is depicted in FIG. 2. Circuit 10 includes a differential amplifier structure 12 including a differential amplifier 14. Differential amplifier 14 includes differential input terminals 20, 22 and differential output terminals 24, 26. For illustrative purposes, differential amplifier structure 12 is shown including switches 23, 25 coupled between differential input terminals 20, 22 and differential output terminals 24, 26, respectively. It should be appreciated that the specifics of differential amplifier structure 12 are provided only for illustrative purposes and do not limit the scope of the invention.

Circuit 10 includes a common mode feedback amplifier (CMFA) 18. Feedback output terminal 19 of CMFA 18 is connected to a common mode feedback input terminal 16 of differential amplifier 14. CMFA 18 includes two negative acting input terminals 28, 29 and two positive acting input terminals 30, 32. Negative acting input terminals 28, 29 are configured to receive a common mode reference voltage (Vcm). CMFA 18 is configured to provide a feedback voltage at feedback output terminal 19 in accordance with differences between the voltages at positive acting input terminals 30, 32 and the common mode reference voltage at negative acting input terminals 28, 29, respectively.

Circuit 10 also includes two capacitor pairs 34, 36, each including two capacitors 34a, 34b or 36a, 36b coupled in series between differential output terminals 24, 26. Positive acting input terminal 30 is connected to interconnect 38 between capacitors 34a, 34b and positive acting input terminal 32 is connected to interconnect 40 between capacitors 36a, 36b. Capacitors, e.g., 34a, 34b, in a capacitor pair, e.g., 34, are substantially matched. That is, parameters of capacitors 34a, 34b are substantially the same. According to an embodiment, the four capacitors 34a, 34b, 36a, 36b are substantially matched.

Positive acting input terminals 30, 32 are coupled to differential output terminals 24, 26 through switches 42, 44 therebetween, respectively. Switches 23, 25, 42, and 44 each has an on state during a sampling phase and an off state during a holding phase.

In operation, during a sampling phase (switches 23, 25, 42 and 44 are on), differential input terminals 20, 22 are shorted to differential output terminals 24, 26, respectively. Differential output terminals 24, 26 are also shorted to positive acting inputs 30, 32, respectively such that voltages at differential output terminals 24, 26 are compared with the common mode reference voltage at negative acting input terminals 28, 29, which actively drives voltages at differential output terminals 24, 26 to the common mode reference voltage.

During a holding phase (switches 23, 25, 42, and 44 are off), positive acting input terminals 30, 32 each is coupled to the voltage between differential output terminals 24, 26 through the respective capacitor pair 34, 36. In this way, substantially half of the voltage between differential output terminals 24, 26 is input to each positive acting input terminal 30, 32 and capacitor pairs 34, 36 effectively couple changes in the common mode voltage (included in the differential output voltage between differential output terminals 24, 26) into CMFA 18. As such, the input voltage swing to positive acting input terminals 30, 32 is restricted to plus or minus (approximately) 10 mV during the holding phase.

Figure 3:
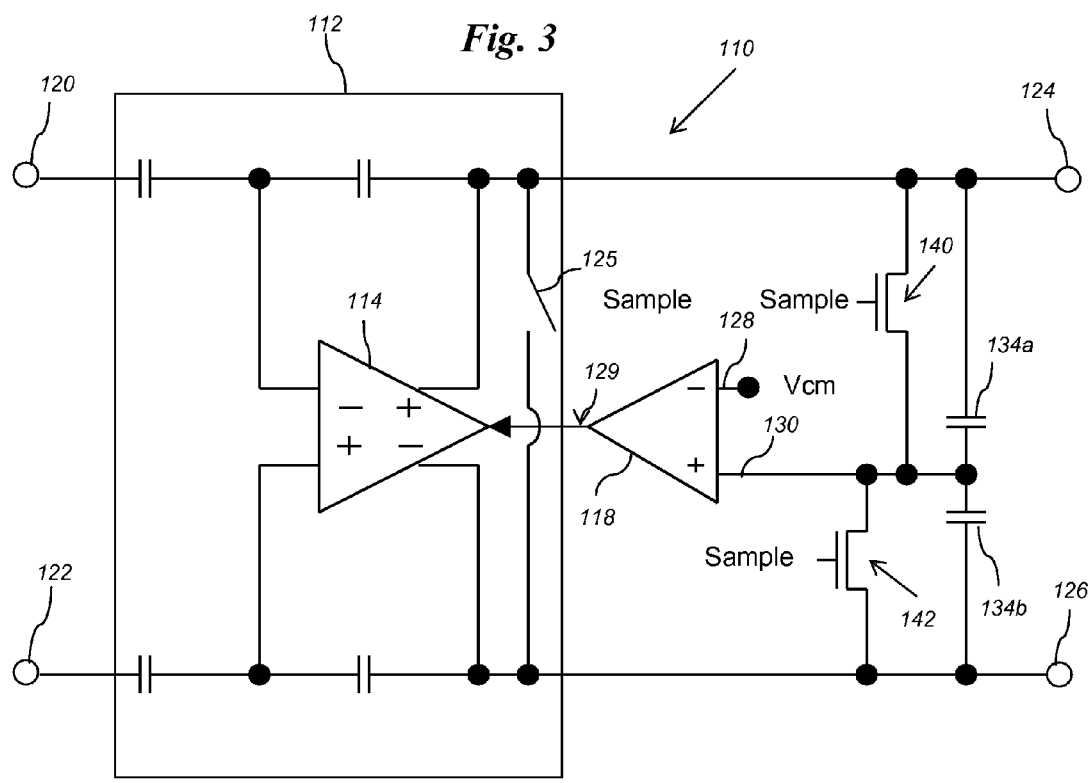
FIG. 3 depicts a structure according to another embodiment.

FIG. 3 depicts another embodiment of a circuit 110 including a differential amplifier structure 112. Circuit 110 is similar to circuit 10 except that CMFA 118 has a single negative acting input terminal 128 and a single positive acting input terminal 130. Negative acting input terminal 128 is configured to receive a common mode reference voltage (Vcm). Positive acting input terminal 130 is coupled to both differential output terminals 124, 126 of differential amplifier 114 through switches 140, 142. Positive acting input terminal 130 is also coupled to differential outputs 124, 126 through substantially matched capacitors 134a, 134b. CMFA 118 is configured to provide a feedback voltage to differential amplifier 114 in accordance with a difference between the common mode reference voltage and a voltage at positive acting input terminal 130.

Differential output terminals 124, 126 are coupled through switch 125. Switches 125, 140, 142 have an on state during a sampling phase and an off state during a holding phase.

Figure 4:
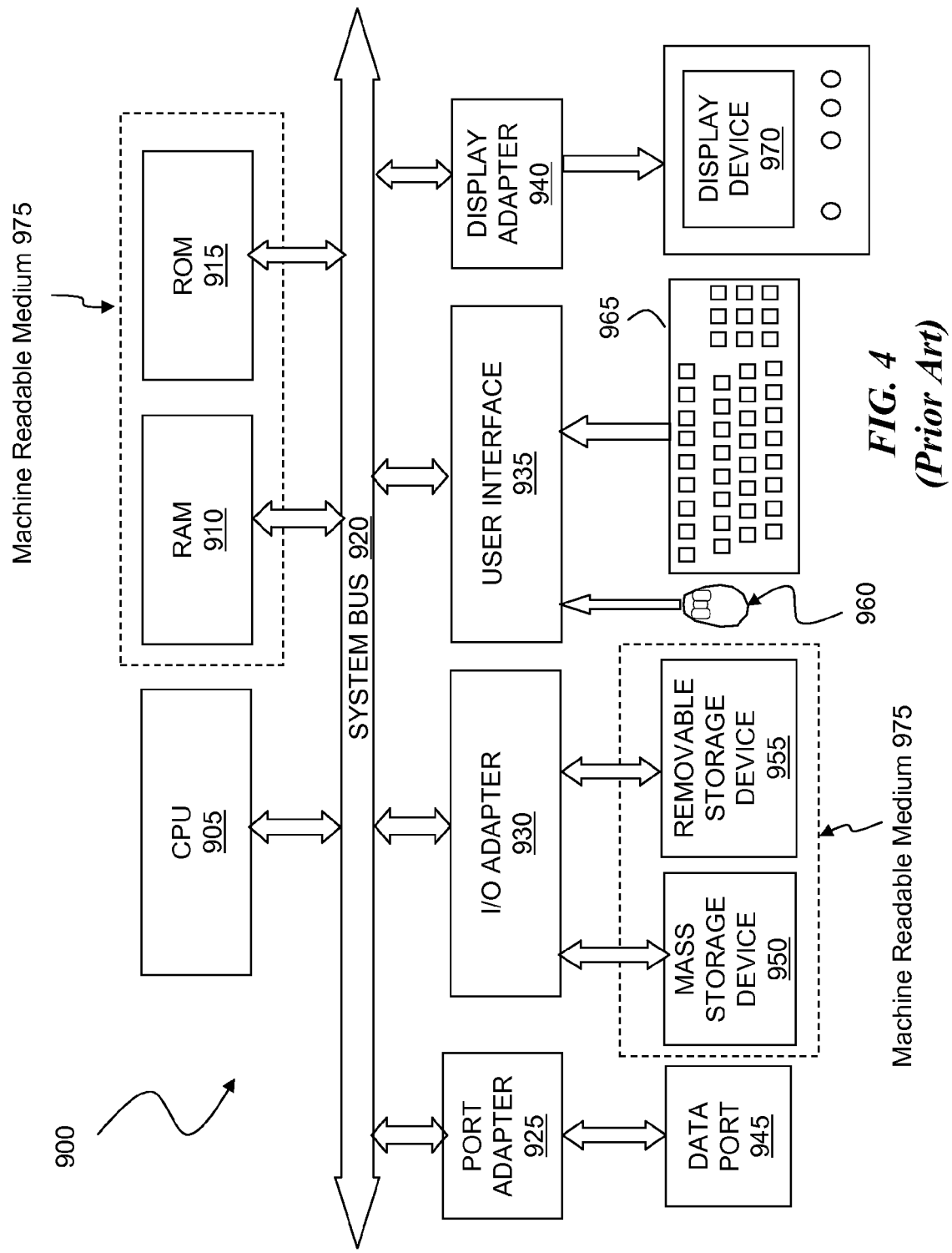
FIG. 4 depicts a block diagram of a general-purpose computer system.

FIG. 4 depicts a block diagram of a general-purpose computer system 900 that can be used to implement circuits 10, 110, and a circuit design structure described herein. The design structure may be coded as a set of instructions on removable or hard media for use by the general-purpose computer 900. The computer system 900 has at least one microprocessor or central processing unit (CPU) 905. The CPU 905 is interconnected via a system bus 920 to machine readable media 975, which includes, for example, a random access memory (RAM) 910, a read-only memory (ROM) 915, a removable and/or program storage device 955, and a mass data and/or program storage device 950. An input/output (I/O) adapter 930 connects mass storage device 950 and removable storage device 955 to system bus 920. A user interface 935 connects a keyboard 965 and a mouse 960 to the system bus 920, a port adapter 925 connects a data port 945 to the system bus 920, and a display adapter 940 connects a display device 970 to the system bus 920. The ROM 915 contains the basic operating system for computer system 900. Examples of removable data and/or program storage device 955 include magnetic media such as floppy drives, tape drives, portable flash drives, zip drives, and optical media such as CD ROM or DVD drives. Examples of mass data and/or program storage device 950 include hard disk drives and non-volatile memory such as flash memory. In addition to the keyboard 965 and mouse 960, other user input devices such as trackballs, writing tablets, pressure pads, microphones, light pens and position-sensing screen displays may be connected to user interface 935. Examples of the display device 970 include cathode-ray tubes (CRT) and liquid crystal displays (LCD).

A machine readable computer program may be created by one of skill in the art and stored in computer system 900 or a data and/or any one or more of machine readable medium 975 to simplify the practicing of this invention. In operation, information for the computer program created to run the present invention is loaded on the appropriate removable data and/or program storage device 955, fed through data port 945, or entered using keyboard 965. A user controls the program by manipulating functions performed by the computer program and providing other data inputs via any of the above mentioned data input means. The display device 970 provides a way for the user to accurately control the computer program and perform the desired tasks described herein.

Figure 5:
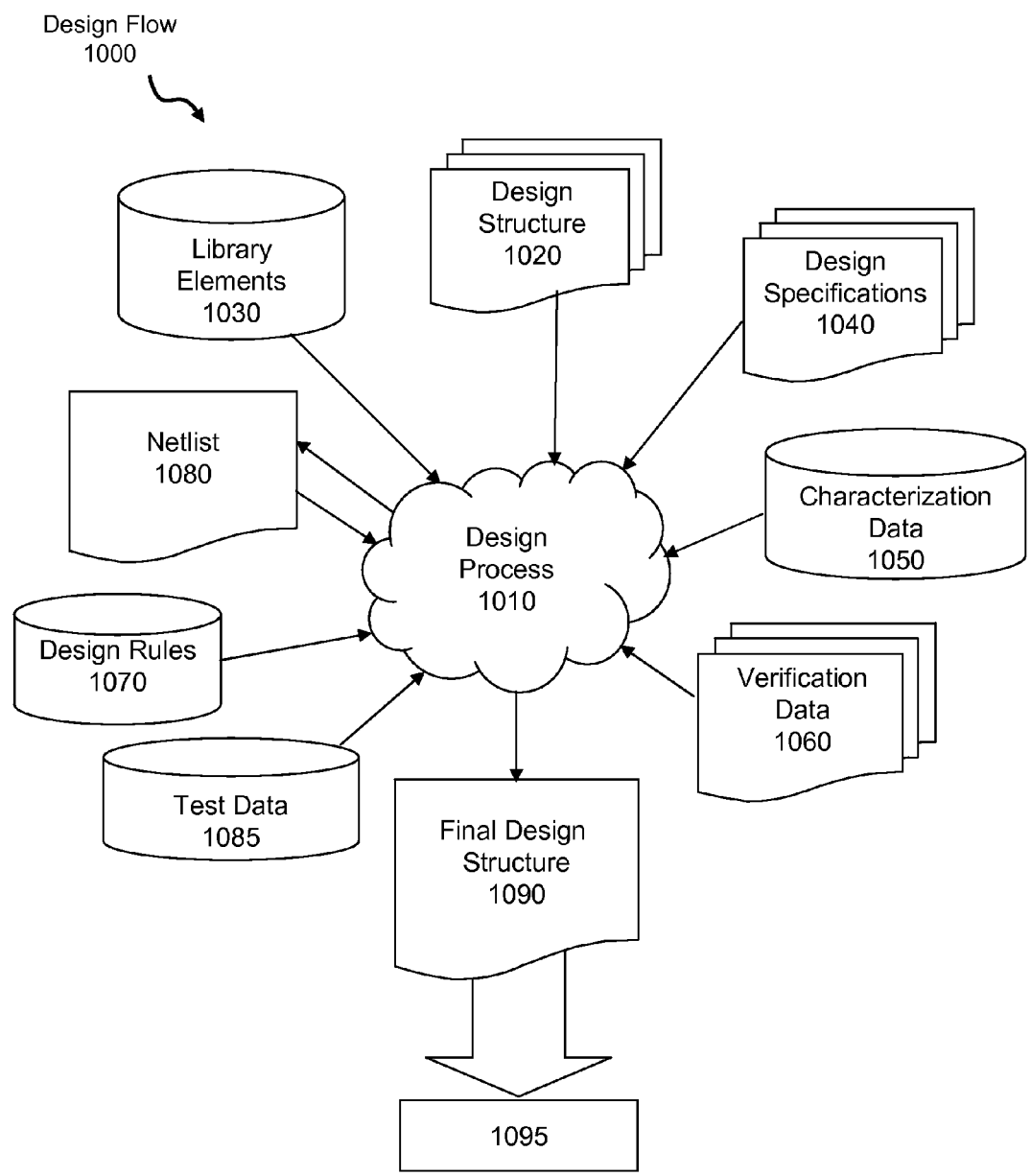
FIG. 5 depicts a block diagram of an exemplary design flow.

FIG. 5 depicts a block diagram of an example design flow 1000, which may vary depending on the type of IC being designed. For example, a design flow 1000 for building an application specific IC (ASIC) will differ from a design flow 1000 for designing a standard component. A design structure 1020 is an input to a design process 1010 and may come from an IP provider, a core developer, or other design company. The design structure 1020 comprises a circuit 10, 110 in the form of schematics or HDL, a hardware-description language, (e.g., Verilog, VHDL, C, etc.). The design structure 1020 may be on one or more of machine readable medium 975 as shown in FIG. 4. For example, the design structure 1020 may be a text file or a graphical representation of circuit 10, 110. The design process 1010 synthesizes (or translates) the circuit 10, 110 into a netlist 1080, where the netlist 1080 is, for example, a list of fat wires, transistors, logic gates, control circuits, I/O, models, etc., and describes the connections to other elements and circuits in an integrated circuit design and recorded on at least one machine readable medium 975.

The design process 1010 includes using a variety of inputs; for example, inputs from library elements 1030 which may house a set of commonly used elements, circuits, and devices, including models, layouts, and symbolic representations, for a given manufacturing technology (e.g., different technology nodes, 32 nm, 45 nm, 90 nm, etc.), design specifications 1040, characterization data 1050, verification data 1060, design rules 1070, and test data files 1085, which may include test patterns and other testing information. The design process 1010 further includes, for example, standard circuit design processes such as timing analysis, verification tools, design rule checkers, place and route tools, etc. One of ordinary skill in the art of integrated circuit design can appreciate the extent of possible electronic design automation tools and applications used in design process 1010 without deviating from the scope and spirit of the invention.

Ultimately, the design process 1010 translates the circuit 10, 110 along with the rest of the integrated circuit design (if applicable), into a final design structure 1090 (e.g., information stored in a GDS storage medium). The final design structure 1090 may comprise information such as, for example, test data files, design content files, manufacturing data, layout parameters, wires, levels of metal, vias, shapes, test data, data for routing through the manufacturing line, and any other data required by a semiconductor manufacturer to produce circuit 10, 110. The final design structure 1090 may then proceed to a stage 1095 of design flow 1000; where stage 1095 is, for example, where final design structure 1090: proceeds to tapeout, is released to manufacturing, is sent to another design house or is sent back to the customer.

The foregoing description of the preferred embodiments of this disclosure has been presented for purposes of illustration and description. It is not intended to be exhaustive or to limit the disclosure to the precise form disclosed, and obviously, many modifications and variations are possible.

What is claimed is:

1. A structure, comprising:
   a differential amplifier including a first output terminal, a second output terminal and a common mode feedback input terminal;
   a common mode feedback amplifier including a first input terminal configured to receive a common mode reference voltage, a second input terminal, and a feedback output terminal electrically connected to the common mode feedback input terminal and configured to provide a feedback voltage in accordance with a difference between the common mode reference voltage and a voltage at the second input terminal;
   a first switch coupled between the second input terminal and at least one of the first output terminal and the second output terminal, the first switch having an on state during a first time period and an off state during a second time period;
   a first pair of substantially matched capacitors, one of the first capacitor pair coupled between the second input terminal and the first output terminal, the other of the first capacitor pair coupled between the second input terminal and the second output terminal;
   a second switch having an on state during the first time period and an off state during the second time period; and
   a second pair of substantially matched capacitors;
   wherein the common mode feedback amplifier further includes a third input terminal electrically connected to the common mode reference voltage and a fourth input terminal, the common mode feedback amplifier configured to provide the feedback voltage in accordance with the difference between the common mode reference voltage and the voltage at the second input terminal and a difference between the common mode reference voltage and a voltage at the fourth input terminal, and wherein one of the second capacitor pair coupled between the fourth input terminal and the first output terminal, the other of the second capacitor pair coupled between the fourth input terminal and the second output terminal; and
   wherein the first switch is coupled between the second input terminal and the first output terminal and the second switch is coupled between the fourth input terminal and the second output terminal.

2. The structure of claim 1, wherein the first switch includes two switches coupled between the second input terminal and each of the first and the second output terminals, respectively.

3. The structure of claim 1, wherein the four capacitors of the first capacitor pair and the second capacitor pair are substantially matched.

4. A design structure embodied in a machine readable medium used in a design flow process, the design structure comprising a circuit, the circuit comprising:
   a differential amplifier including a first output terminal, a second output terminal and a common mode feedback input terminal;
   a common mode feedback amplifier including a first input terminal configured to receive a common mode reference voltage, a second input terminal, and a feedback output terminal electrically connected to the common mode feedback input terminal and configured to provide a feedback voltage in accordance with a difference between the common mode reference voltage and a voltage at the second input terminal;
   a first switch coupled between the second input terminal and at least one of the first output terminal and the second output terminal, the first switch having an on state during a first time period and an off state during a second time period;
   a first pair of substantially matched capacitors, one of the first capacitor pair coupled between the second input terminal and the first output terminal, the other of the first capacitor pair coupled between the second input terminal and the second output terminal;
   a second switch having an on state during the first time period and an off state during the second time period; and
   a second pair of substantially matched capacitors;
   and the common mode feedback amplifier farther includes a third input terminal electrically connected to the common mode reference voltage and a fourth input terminal, the common mode feedback amplifier configured to provide the feedback voltage in accordance with the difference between the common mode reference voltage and the voltage at the second input terminal and a difference between the common mode reference voltage and a voltage at the fourth input terminal, and wherein one of the second capacitor pair coupled between the fourth input terminal and the first output terminal, the other of the second capacitor pair coupled between the fourth input terminal and the second output terminal; and
   wherein the first switch is coupled between the second input terminal and the first output terminal and the second switch is coupled between the second output terminal and the fourth input terminal.

5. The design structure of claim 4, wherein the first switch includes two switches coupled between the second input terminal and each of the first and the second output terminals, respectively.

6. The design structure of claim 5, wherein the four capacitors of the first capacitor pair and the second capacitor pair are substantially matched.

* * * * *